United States Patent
Lee et al.

[19]

[11] Patent Number: 6,008,989
[45] Date of Patent: Dec. 28, 1999

[54] HEAT SINK ASSEMBLY

[75] Inventors: Shun-Jung Lee, Pan-Chiao; Hsieh-Kun Lee, Chung-Ho, both of Taiwan

[73] Assignee: Hon Hai Precision Ind. Co., Ltd., Taipei Hsien, Taiwan

[21] Appl. No.: 09/113,627

[22] Filed: Jul. 10, 1998

[30] Foreign Application Priority Data

Jul. 10, 1997 [TW] Taiwan ................................. 86211612

[51] Int. Cl.⁶ ....................................................... H05K 7/20
[52] U.S. Cl. ........................... 361/704; 174/16.3; 257/719
[58] Field of Search ................... 165/80.2, 80.3, 165/121, 185; 174/16.3; 257/718–719, 722, 726–727; 361/697, 704, 707, 709

[56] References Cited

U.S. PATENT DOCUMENTS

| | | | |
|---|---|---|---|
| 5,835,347 | 10/1998 | Chu | 361/697 |
| 5,864,464 | 1/1999 | Lin | 361/697 |
| 5,870,288 | 2/1999 | Chen | 361/704 |

Primary Examiner—Gregory Thompson

[57] ABSTRACT

A securing device for attaching a heat sink to a vertically mounted CPU module comprises a pair of abutting members, a pair of engaging brackets, and a pair of sleeves. The heat sink defines two grooves between cooling elements extending from a base thereof and a hole through the base of the heat sink at the bottom of each groove for receiving a first end of the corresponding abutting member. Each engaging bracket is formed with a base, two extension portions extending from opposite distal ends of the base, a curved resilient claw extending from an end of each extension portion for engaging with openings defined in the CPU module, and a hole defined in the base for receiving a second end of each abutting member. Each sleeve engages with the second end of the corresponding abutting member and a jig can be used to facilitate the insertion of the claws into the corresponding openings of the CPU whereby the heat sink is firmly secured to the CPU module.

20 Claims, 7 Drawing Sheets

4,008,989

HEAT SINK ASSEMBLY

BACKGROUND OF THE INVENTION

1. Field of the Invention

The present invention generally relates to a heat sink assembly, and more particularly to a securing device for a heat sink assembly which facilitates the removable attachment of a heat sink module to an electronic device package.

2. The Prior Art

Many high speed and high power electronic devices generate significant amounts of heat which must be dissipated to prevent damage to the device. In some device packages, the heat generated is sufficiently dissipated by the enclosure, header, or leads. For devices which generate high levels of thermal energy, a heat sink having a large surface area is attached to the device to dissipate the generated thermal energy into the surrounding environment thereby preventing overheating thereof. A standard heat sink module has a flat horizontal base with a plurality of vertical cooling elements extending from a top surface thereof, and a bottom surface of the base is in thermal contact with a surface of the device package.

Conventionally, the device package is a microprocessor integrated circuit (IC) received in a pin grid array socket mounted to a printed circuit board. A resilient metal clip is used to clamp the heat sink module to the IC and the socket thereby horizontally mounting the entire assembly to the printed circuit board. The clip is commonly attached by means of special installing tools which complicates the assembly process thereof. Since heat sink modules of different dimension each require a different sized clip for properly engaging with the IC and the socket, each clip must be suitably adapted to facilitate the assembly process which increases manufacturing costs. Such prior art clips for heat sink modules are disclosed in U.S. Pat. Nos. 5,208,731, 5,241,453, 5,276,585, 5,357,404, 5,381,305, and 5,396,402.

As the trend of the computer industry continues toward miniaturization, electronic device packages, such as a CPU, are modularized and vertically mounted onto a PCB by means of a card edge connector for effectively occupying limited space on the PCB. Conventional clips cannot firmly secure a heat sink module to the vertically mounted CPU module. Therefore, the heat sink module may become easily loosened due to affects of shock and vibration acting on the assembly thereby greatly diminishing the heat dissipating capability thereof.

Therefore, an improved securing device for attaching a heat sink module to an electronic device package is required which can overcome the above mentioned drawbacks.

SUMMARY OF THE INVENTION

Accordingly, one objective of the present invention is to provide a securing device for a heat sink assembly for easily and removably attaching a heat sink module to an electronic device package.

Another objective of the present invention is to provide a securing device for a heat sink assembly which can firmly contact and secure a heat sink module to a vertically mounted electronic device package.

A further objective is to provide a securing device for a heat sink assembly which can be used with heat sinks of different dimension.

Still another objective of the present invention is to provide a securing device for a heat sink assembly which can withstand affects of shock and vibration.

Still a further objective of the present invention is to provide a securing device for a heat sink assembly which is simple in construction, inexpensive to manufacture and capable of extended use.

To fulfill the above objectives, in accordance with one aspect of the present invention, a securing device for attaching a heat sink to a CPU module comprises a pair of abutting members, a pair of substantially U-shaped engaging brackets, and a pair of sleeves. The heat sink defines two grooves between cooling elements extending from a base thereof, and a hole is defined through the base of the heat sink at the bottom of each groove. Each abutting member comprises a rod with a cylindrical abutting portion formed near a first end thereof. Each engaging bracket is formed with a base, two extension portions extending from opposite distal ends of the base, a curved resilient claw extending from the end of each extension portion, and a hole defined in the base.

The CPU module is vertically mounted to a PCB by means of a card edge connector, and a plate formed on an outer surface of the CPU module contacts the base of the heat sink. The first end of each abutting member is received in the corresponding hole of the heat sink, and a second end of each abutting member extends through the hole of the corresponding engaging bracket. Each sleeve engages with the corresponding second end of the abutting member while the claws of the engaging brackets enter corresponding openings defined in the CPU module. A jig can be used to facilitate the insertion of the claws into the corresponding openings of the CPU. Assembly may also be completed by urging the brackets in position by hand.

These and additional objectives, features, and advantages of the present invention will become apparent after reading the following detailed description of the preferred embodiments of the invention taken in conjunction with the appended drawing figures.

DETAILED DESCRIPTION OF THE PREFERRED EMBODIMENTS

Detailed reference will now be made to the preferred embodiments of the present invention.

Figure 1:
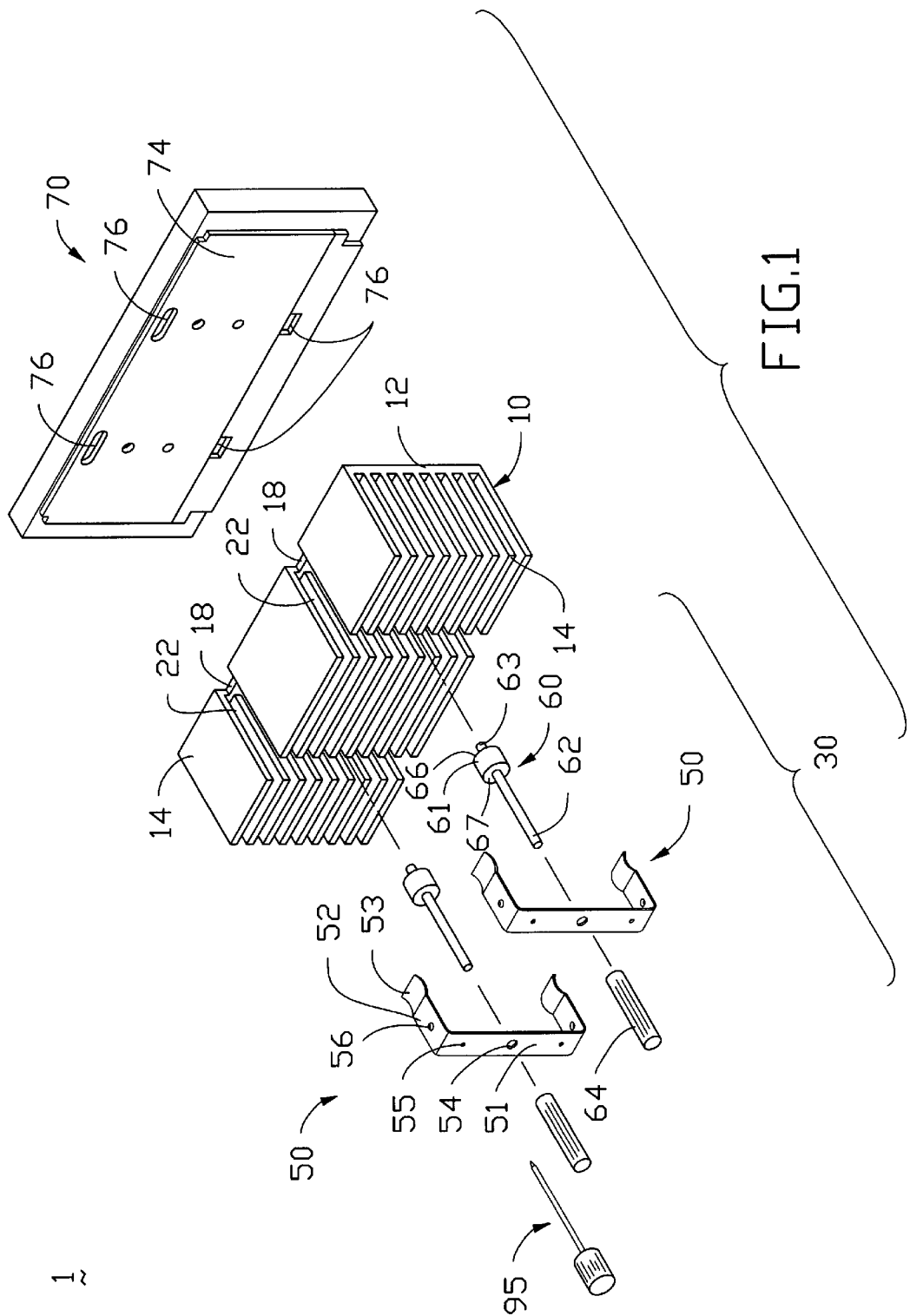
FIG. 1 is an exploded view of the heat sink assembly in accordance with the present invention.

Referring to FIG. 1, a securing device 30 for attaching a heat sink 10 to a CPU module 70 comprises a pair of abutting members 60, a pair of substantially U-shaped engaging brackets 50, and a pair of sleeves 64.

Figure 2:
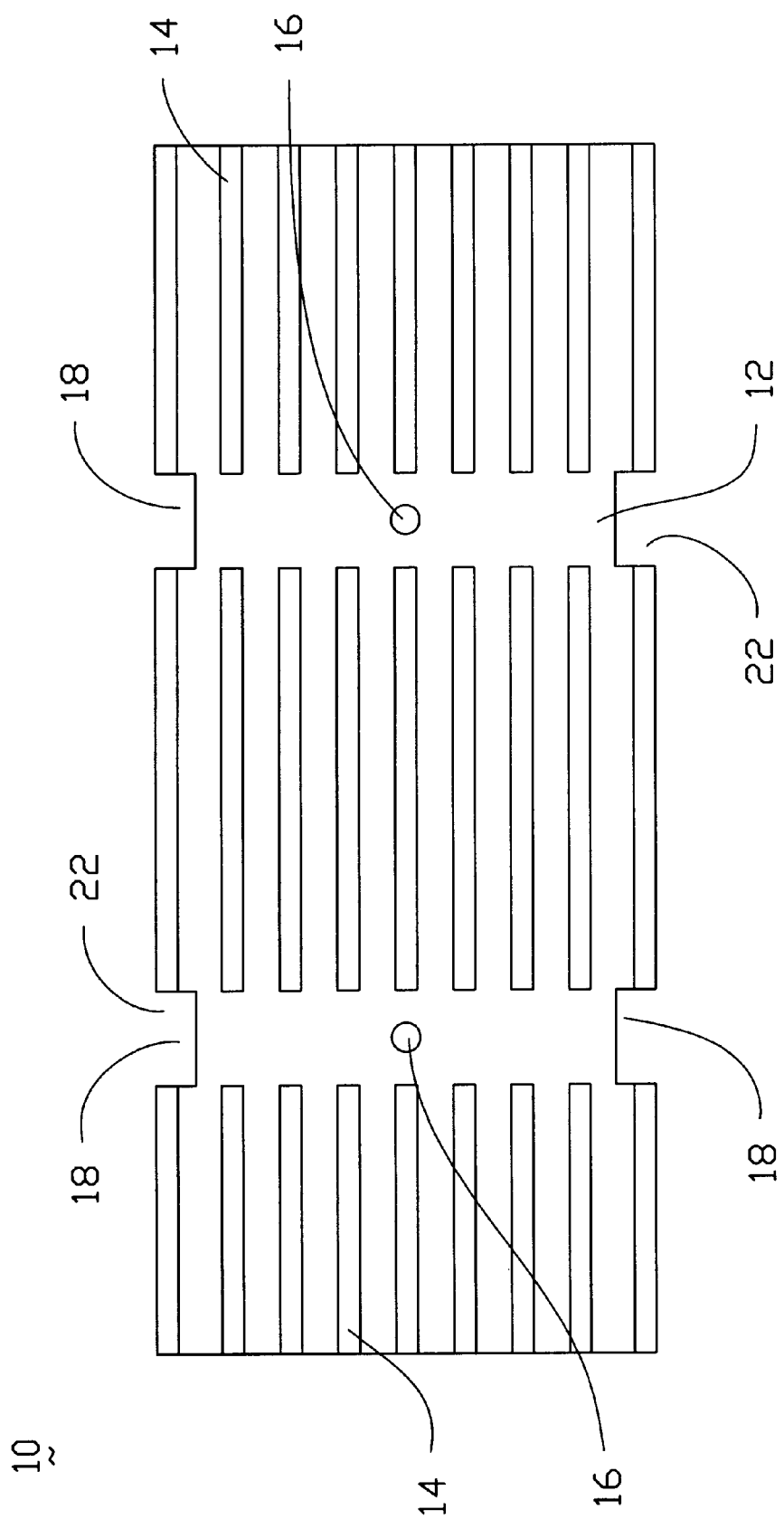
FIG. 2 is an elevational view of a front face of a heat sink in accordance with the present invention.

Also referring to FIG. 2, the heat sink 10 has a plurality of cooling fins 14 extending from a base 12 thereof and aligned in three columns. A groove 22 is defined between adjacent columns of cooling fins 14, a first hole 16 is defined through the base 12 of the heat sink 14 at the bottom of each groove 22, and a pair of cutouts 18 are defined at opposite ends of each groove 22.

Each abutting member 60 comprises an elongate rod 65 with a cylindrical abutting portion 61 formed near a first end 63 thereof. The abutting portion 61 defines a front face 66 and a rear face 67. Each engaging bracket 50 is formed with a main body 51, two extension portions 52 extending from opposite distal ends of the main body 50, a curved resilient claw 53 extending from an end of each extension portion 52, and a second hole 54 defined in the base 51 for extension of a second end 62 of the abutting member 60 therethrough.

Figure 4:
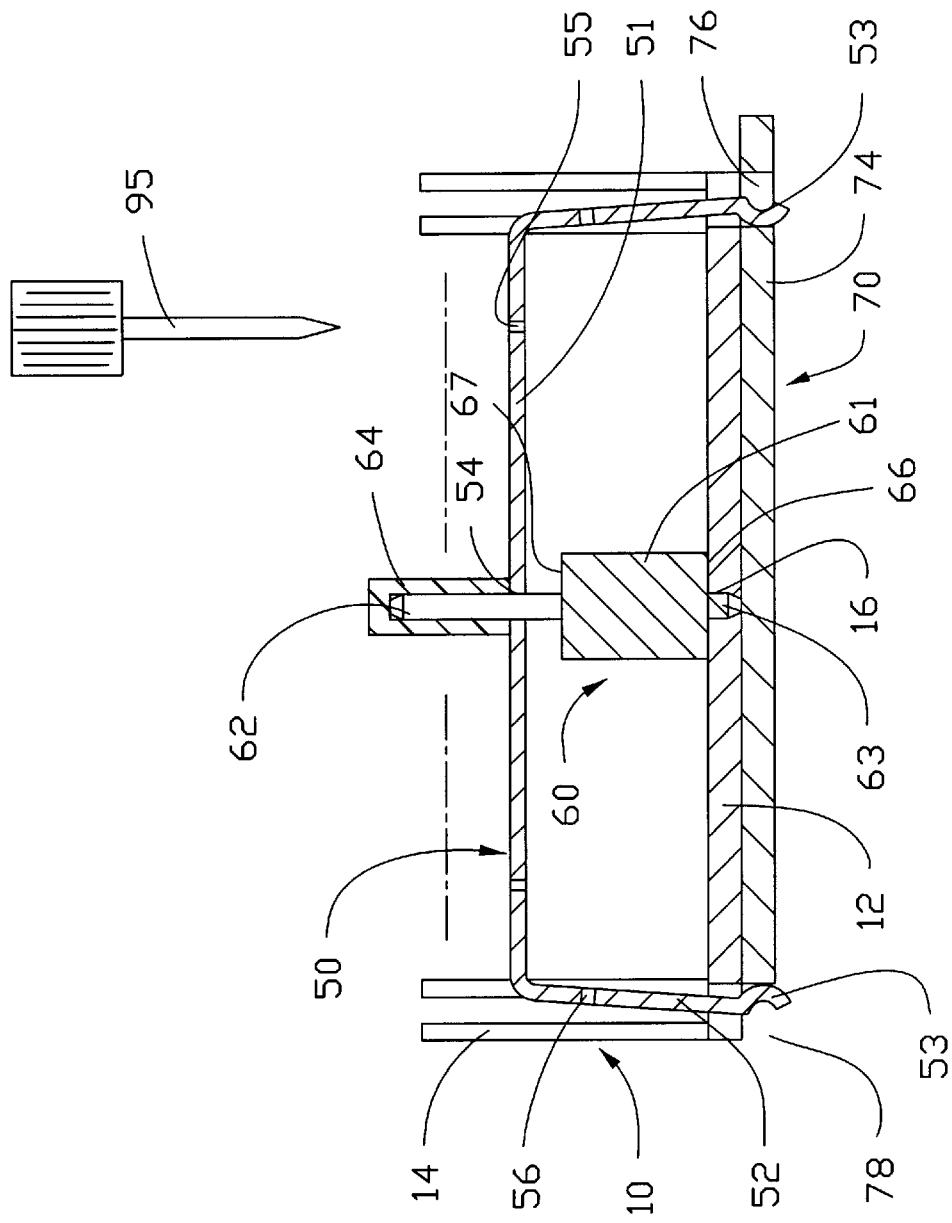
FIG. 4 is a cross sectional view taken along line IV of FIG. 3.

In assembly, the CPU module 70 is vertically mounted to a PCB (not shown) by means of a card edge connector (not shown), and a plate 74 formed on an outer surface thereof contacts the base 12 of the heat sink 10. The first end 63 of each abutting member 60 is received in the corresponding first hole 16 of the heat sink 10 and abuts against the plate 74 of the CPU module 70, and the second end 62 of each abutting member 60 extends through the second hole 54 of the corresponding engaging bracket 50 to engage with the corresponding sleeve 64. The front face 66 of each abutting portion 61 abuts against the base 12 of the heat sink 10 and the rear face 67 of each abutting portion 61 abuts against the main body 51 of the engaging bracket. The claws 53 of the engaging brackets 50 extend through the cutouts 18 of the heat sink 10 and enter corresponding openings 76 defined in the CPU module 70 as seen in FIG. 4.

Figure 3:
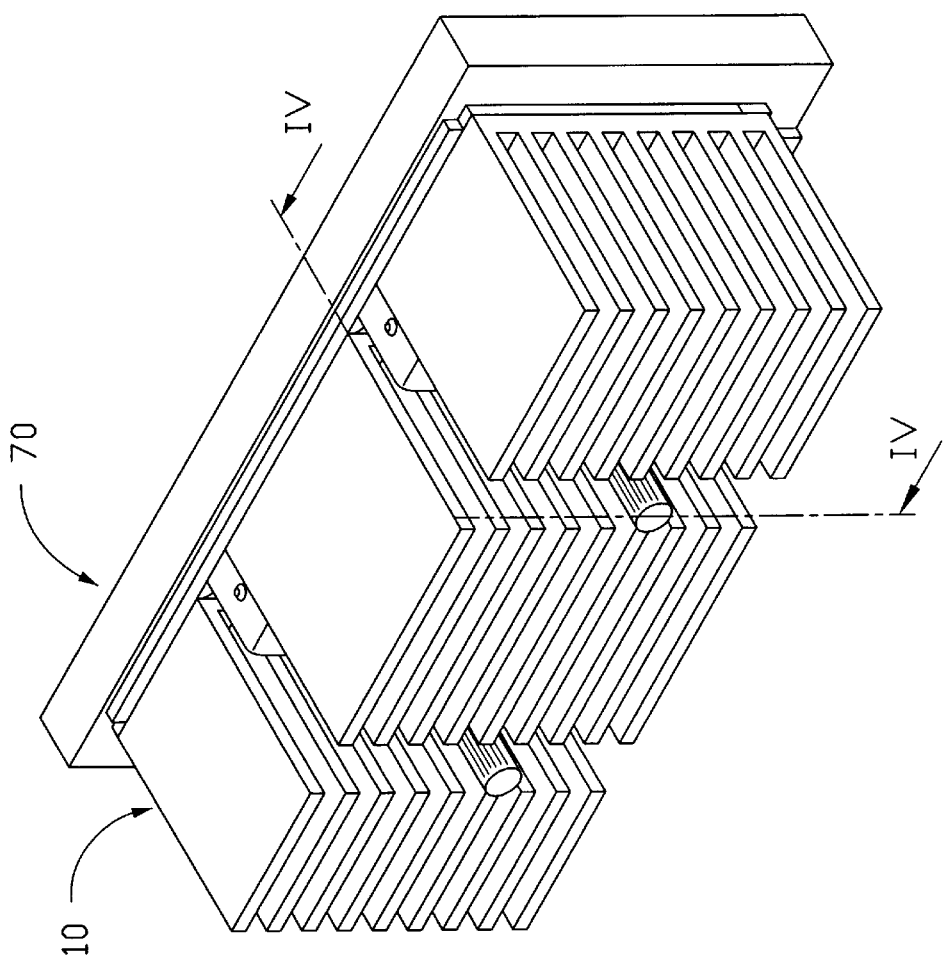
FIG. 3 is a perspective view of the assembled heat sink assembly of FIG. 1.
Figure 5:
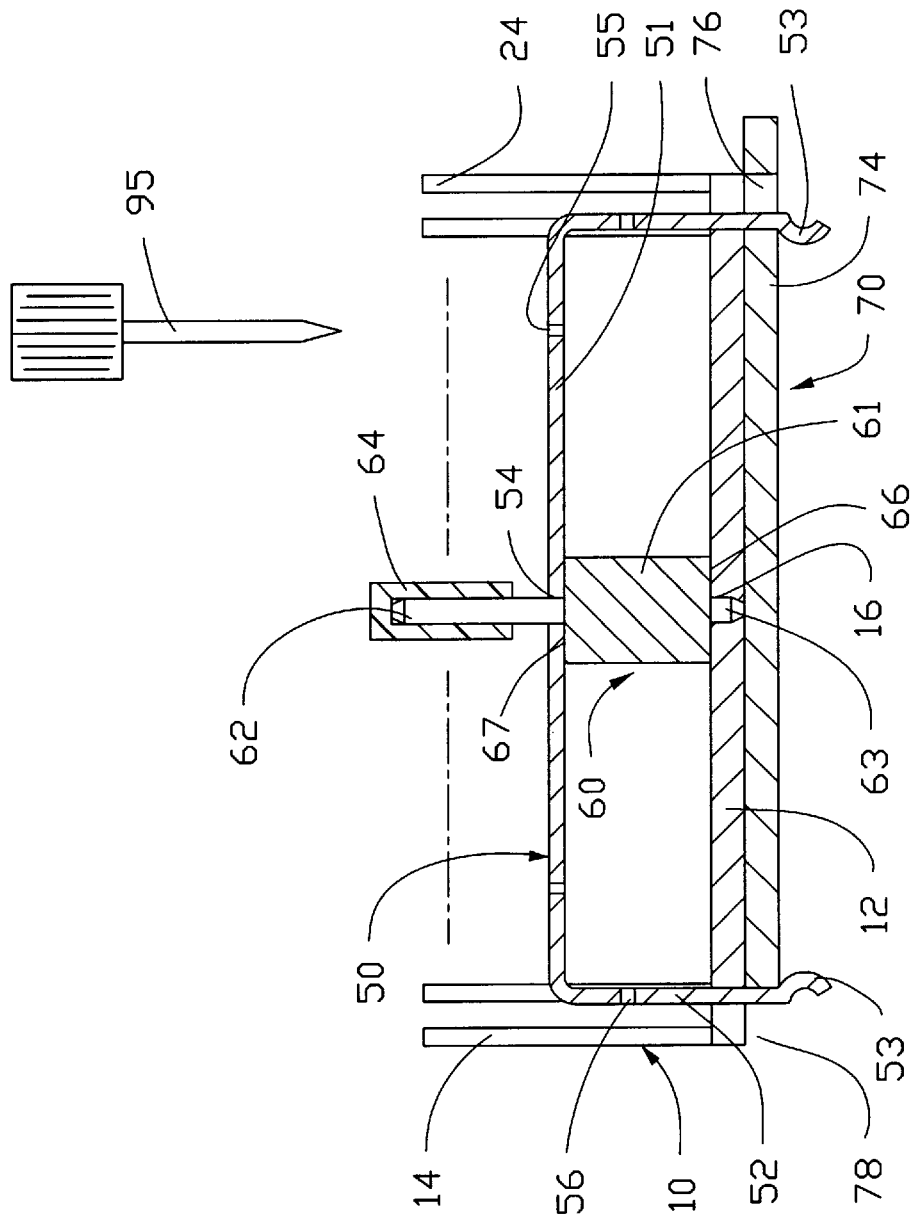
FIG. 5 is similar to FIG. 4 except that the engaging bracket is in a final assembled state.

Referring to FIG. 5, a jig 95 can be used to facilitate the insertion of the claws 53 into the corresponding openings 76 of the CPU module 70. A pair of third holes 55 having a smaller diameter than the jig 95 are defined in the main body 51 of each engaging bracket 50 on either side of the first holes 54. When the jig 95 is inserted into one of the third holes 55 and the claws 53 of the engaging bracket 50 are aligned with the openings 76 of the CPU module 70, a force exerted on the jig 95 will cause the claw 53 to be received in the corresponding opening 76. Complete assembly can also be attained by manually urging the engaging brackets 50 in position by means of the sleeves 64 without the use of an external tool. The heat sink 10 is then secured to the CPU module 70 by means of cooperation between the claws 53 of the engaging brackets 50 and the openings 76 of the CPU module 70 as seen in FIG. 3. The resiliency of the claws 53 provide the heat sink assembly with the capability to withstand affects of shock and vibration.

If necessary, the heat sink 10 can be easily detached from the CPU module 70 for maintenance. A disassembly hole 56 is defined in each extension portion 52 of the engaging brackets 50. A tool such as the jig 95 can be positioned within the disassembly hole 56 and a force exerted thereon will disengage the claws 53 of the engaging bracket 50 from the openings 76 of the CPU module 70, thereby detaching the heat sink 10 from the CPU module 70.

Figure 6:
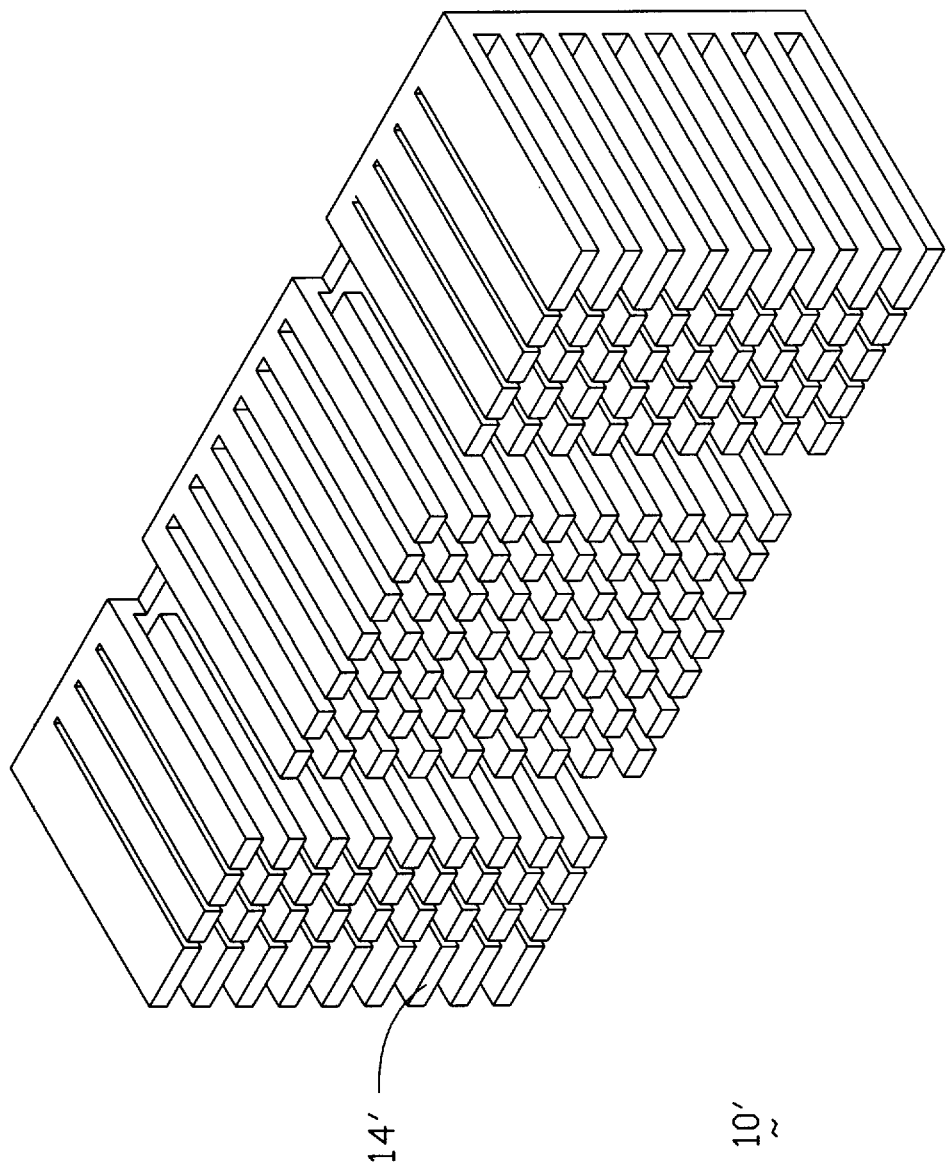
FIG. 6 is a perspective view of a heat sink in accordance with a second embodiment of the present invention.

Referring to FIG. 6, a heat sink 10' in accordance with a second embodiment of the present invention having a plurality of cooling elements 14 extending from a base thereof can replace the heat sink 10 of the first embodiment without affecting the secure engagement between the heat sink 10' and the CPU module 70 supplied by the securing device 30.

Figures 7, 8:
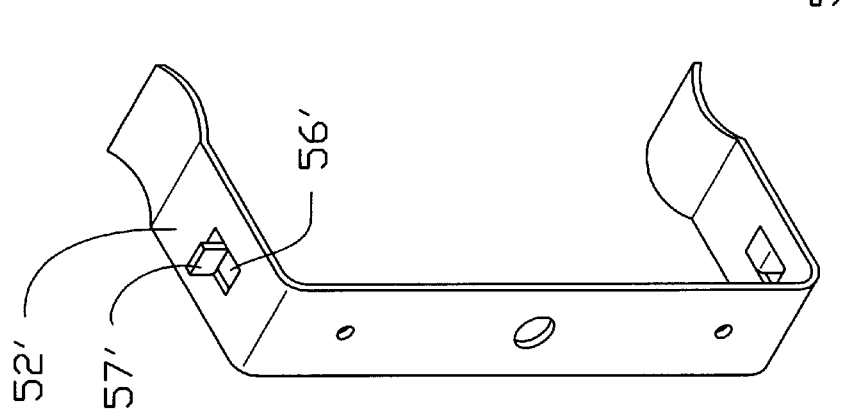
FIG. 7 is a perspective view of an engaging bracket in accordance with a third embodiment of the present invention.
FIG. 8 is a perspective view of an engaging bracket in accordance with a fourth embodiment of the present invention.

FIG. 7 shows an engaging bracket 50' with another type of disassembly hole 56' formed in the extension portion 52' by a stamping procedure whereby a tab 57' projects outward from each extension portion. FIG. 8 shows an engaging bracket 50" with yet another type of disassembly hole 56" defined in the extension portion 52" by a punching procedure whereby a projection (not labeled) is formed surrounding the disassembly hole 56".

The above description clearly discloses a securing device for easily and removably attaching a heat sink to a vertically mounted CPU module. Resilient claws of the securing device securely engaged with openings defined in the CPU provide the heat sink assembly with the capability to withstand affects of shock and vibration. In addition, the simplified design and improved function of the securing device allow heat sinks of different dimension to be secured thereby decreasing manufacturing costs.

While the present invention has been described with reference to specific embodiments, the description is illustrative of the invention and is not to be construed as limiting the invention.

Therefore, various modifications to the present invention can be made to the preferred embodiment by those skilled in the art without departing from the true spirit and scope of the invention as defined by the appended claims.

We claim:

1. A heat sink assembly comprising:
   an electronic device package having a plate on a surface thereof;
   a heat sink having a base in contact with the plate of the device package, a plurality of cooling elements extending from the base and arranged in two columns, a groove defined between the two columns of cooling elements, and a first hole defined in the base at a bottom of the groove; and
   a securing device for attaching the heat sink to the device package, said securing device comprising:
      an engaging bracket including a main body and an extension portion extending from each distal end of the main body; and
      an elongate abutting member having a first end received in the first hole of the heat sink to abut against the plate of the device package, and a second end engaging the engaging bracket;
      wherein the main body of the engaging bracket is received in the groove of the heat sink and the extension portions of the engaging bracket engage with the device package for firmly and elastically attaching the heat sink to the device package by the abutting member.

2. The assembly as claimed in claim 1, wherein a second hole is defined in the main body of the engaging bracket and the second end of the abutting member extends therethrough.

3. The assembly as claimed in claim 2, wherein the securing device further comprises a sleeve for engaging with the second end of the abutting member.

4. The assembly as claimed in claim 1, wherein the plate of the device package defines a pair of openings and the extension portions of the engaging bracket are received therein.

5. The assembly as claimed in claim 4, wherein the engaging bracket further has curved resilient claws respectively extending from ends of the extension portions thereof, said claws received in the corresponding openings of the device package.

6. The assembly as claimed in claim 1, wherein the base of the heat sink defines a cutout at each distal end of the groove for extension of a corresponding extension portion of the engaging bracket therethrough.

7. The assembly as claimed in claim 1, wherein the abutting member has a cylindrical abutting portion formed near the first end thereof, said abutting portion having a front face abutting against the base of the heat sink and a rear face abutting against the main body of the engaging bracket.

8. The assembly as claimed in claim 1, wherein the electronic device package is a CPU module vertically mounted on a printed circuit board.

9. A securing device for attaching a heat sink having a base to an electronic device package having a plate, comprising:

an engaging bracket including a main body and an extension portion extending from each distal end of the main body; and an abutting member having a first end received in a first hole defined in a base of a heat sink to abut against plate of a device package, and a second end engaging the bracket;

wherein the extension portions of the engaging bracket engage with the device package for elastically and firmly attaching the heat sink to the device package by the abutting member.

10. The securing device as claimed in claim 9, wherein a second hole is defined in the main body of the engaging bracket and the second end of the abutting member extends therethrough.

11. The securing device as claimed in claim 10 further comprising a sleeve for engaging with the second end of the abutting member.

12. The securing device as claimed in claim 9, wherein the plate of the device package defines a pair of openings and the extension portions of the engaging bracket are received therein.

13. The securing device as claimed in claim 12, wherein the engaging bracket further has curved resilient claws respectively extending from ends of the extension portions thereof, said claws received in the corresponding openings of the device package.

14. The securing device as claimed in claim 9, wherein the abutting member has a cylindrical abutting portion formed near the first end thereof, said abutting portion having a front face abutting against the base of the heat sink and a rear face abutting against the main body of the engaging bracket.

15. The securing device as claimed in claim 9, wherein the engaging bracket has a third hole defined in the main body thereof for reception of an end of a jig for facilitating engagement of the securing device with the heat sink and the device package.

16. The securing device as claimed in claim 9, wherein the engaging bracket has a fourth hole defined in each extension portion thereof for reception of an end of a jig for facilitating detachment of the securing device from the heat sink and the device package.

17. The securing device as claimed in claim 16, wherein the fourth hole is formed by a stamping procedure whereby a tab projects outward from each extension portion.

18. The securing device as claimed in claim 16, wherein the fourth hole is defined in the extension portion by a punching procedure whereby a projection is formed surrounding the fourth hole.

19. An arrangement for assembling a heat sink to an electronic device package, comprising:

an engaging bracket having a main body and an extension portion extending from a distal end of the main body;
an abutting member having a first end section abutting against a heat sink and a second end section abutting against the main body of the engaging bracket, when the extension portion of the engaging bracket engages with an electronic device package.

20. The arrangement as claimed in claim 19, wherein the abutting member includes a first end received within a first corresponding hole in the heat sink and a second end received within a second corresponding hole in the engaging bracket.

* * * * *